(12) United States Patent
Kang et al.

(10) Patent No.: US 6,334,926 B1
(45) Date of Patent: Jan. 1, 2002

US006334926B1

(54) METHOD FOR LOW TEMPERATURE LAMINATION OF METALS TO FLUOROPOLYMERS

(75) Inventors: En Tang Kang; Jian-Li Shi; Koon Gee Neoh; Kuang Lee Tan; Cheng Qiang Cui; Thiam Beng Lim, all of Singapore (SG)

(73) Assignee: National University of Singapore and Institute of Microelectronics (SG)

( * ) Notice: Subject to any disclaimer, the term of this patent is extended or adjusted under 35 U.S.C. 154(b) by 0 days.

(21) Appl. No.: 09/327,959

(22) Filed: Jun. 8, 1999

(30) Foreign Application Priority Data

Jun. 9, 1998 (SG) ...................................... 9801368

(51) Int. Cl.⁷ .................................... B32B 31/12
(52) U.S. Cl. .................... 156/272.6; 156/272.2; 156/273.3; 156/275.7; 156/327; 156/330
(58) Field of Search ............................. 156/272.6, 273.3, 156/308.6, 309.3, 326, 272.2, 275.7, 327, 330; 428/420; 204/169; 427/534, 536, 384, 400

(56) References Cited

U.S. PATENT DOCUMENTS 4,743,327 A * 5/1988 DeHaan et al. ........... 156/272.6
5,557,702 A    9/1996 Yoshikawa et al.
5,755,913 A * 5/1998 Liaw et al. ................ 156/272.6

OTHER PUBLICATIONS

Derwent Abstract Accession No. 92–239470/29, JP 04163141–A, Jun. 8, 1992.

* cited by examiner

*Primary Examiner*—Michael A. Tolin
(74) *Attorney, Agent, or Firm*—Birch, Stewart, Kolasch & Birch, LLP

(57) ABSTRACT

The present invention is directed to a method for the lamination of metals, and especially copper, to the surfaces of fluoropolymers at temperatures substantially below the sintering temperatures or melting temperatures of the fluoropolymers. More specifically, the invention is directed to a method for surface modification of fluoropolymers by thermal graft copolymerization with concurrent lamination of a metal (e.g. copper) in the presence of a functional monomer. The process can be carried out under atmospheric conditions and in the complete absence of an added polymerization initiator. The so-laminated fluoropolymer-metal interfaces exhibit T-peel strengths of no less than 8 N/cm and delaminate via cohesive failure inside the fluoropolymer.

16 Claims, No Drawings

METHOD FOR LOW TEMPERATURE LAMINATION OF METALS TO FLUOROPOLYMERS

BACKGROUND OF THE INVENTION

1. Field of the Invention

This invention relates to a method for the low temperature lamination of metals, and especially copper, to the surface of inert fluoropolymers. More specifically, the invention relates to a method for surface modification of fluoropolymers by thermal graft copolymerization with concurrent lamination of copper metal in the presence of a functional monomer.

When thermal grafting or graft copolymerization occurred on the pre-activated surface and interface of a fluoropolymer in contact with a metal surface, lamination occurs simultaneously. The surface and interfacial graft copolymerization with concurrent lamination of the metal are carried out under atmospheric conditions, and in the complete absence of an added polymerization initiator or system degassing. The process and properties can be imparted on the inert surfaces of most fluoropolymers in contact with a preferred metal.

Thermal grafting or graft copolymerization with concurrent lamination can be carried out in the presence of one or more functional monomers including, but not limited to, 1-vinyl imidazole (VIDZ), 1-allyl imidazole, 2-vinyl pyridine (2VP), 4-vinyl pyridine (4VP), 2,4,6-triallyloxy-1,3,5-triazine, 1,2,4-trivinylcyclohexane and triallyl-1,3,5-benzenetricarboxylate, epoxide-containing monomers, hydroxy-containing monomers, amine-containing monomers, monomers of polyelectrolyte and monomers of polyampholyte.

The lap shear adhesion interface can readily exceed the tensile yield strength of the substrate polymer film. The lap shear adhesion strength of the so-laminated fluoropolymer-copper interface can readily exceed the tensile yield strength of the substrate film. The T-peel strengths of the so-laminated fluoropolymer-metal interfaces are in excess of 8 N/cm, with delamination occurs via cohesive failure of the polymer film. The strong adhesion between the polymer and the metal arises from the covalent bonding of the grafted functional chains on the fluoropolymer surface on one hand, and the strong adhesion, with or without charge transfer interaction, of the grafted functional chains to the metal surface on the other.

The present invention distinguishes itself from the prior art in that the grafting/lamination process is carried out at temperatures substantially below the melt processing or sintering temperature of the fluoropolymer and no adhesive is required to effect the lamination process under atmospheric conditions.

2. Description of Related Arts

One of the most important requirements for the fastest microelectronic devices of the near future will be the reduction of the signal interconnection delay time to a small fraction of total switching delay time. One method of lowering this delay time relates to the use of multilayer devices incorporating highly conductive metal, such as copper, and low capacitance dielectrics, such as the fluoropolymers.

Of all the dielectric materials, the fluoropolymer, in particular poly(tetrafluoroethylene) (PTFE) and its derivatives, are ideal dielectric materials, from the standpoints of electrical and thermal properties, for the packaging of microelectronics. With improved adhesion between fluoropolymer surfaces and at the interface of a fluoropolymer and a metal, the application of fluoropolymers in multi-chip module(MCM) packaging, for example, may become a reality. The physical and chemical inertness associated with most of the fluoropolymer, however, dictates the use of more drastic means for achieving the required surface modifications. The strategies of surface chemical and physical modification have been widely implemented for fluoropolymers and hydrocarbon polymers alike.

One of the major drawbacks of the most commonly utilized technique of plasma treatment is that the physicochemical characteristics of the modified polymer surfaces, including surface compositions, are time-ependent. Chain and polar group reorientation in the surface region can result in gradual deterioration of the surface reactivity. Furthermore, anomalous changes in oxygen and fluorine contents, and therefore also surface compositions, may result from the presence of surface hydrocarbon contamination during plasma treatment, as suggested by M. A. Golub, E. S. Lopata, L. S. Finney, *Langmuir*, 10, 3629 (1994). To overcome the time-dependent surface characteristics, the plasma-treated fluoropolymers have been subjected to further surface modification via graft copolymerization, as shown in K. L. Tan, L. L. Woon, H. K. Wong, E. T. Kang and K. G. Neoh, *Macromolecules*, 26, 2832 (1993); E. T. Kang, K. G. Neoh, W. Chen, K. L. Tan, C. C. Huang and D. J. Liaw, *J. Adhesion Sci. Technol.*, 10, 725 (1996); and Tie Wang, E. T. Kang, K, G, Neoh, K. L. Tan, C. Q. Cui and T. B. Lim, *J. Adhesion Sci. Tech.*, 11, 679 (1997). The factors affecting the adhesion of fluoropolymer composites to commercial copper foils have been summarized by L. J. Jimarez, L. J. Matienzo and A. A. Mehta in *Transactions of the ASME*, 115, 256 (1993). The fluoropolymer metallization for microelectronics application has also been reviewed recently by E. Sacher in *Prog. Surf. Sci.* 47 (3), 273 (1994).

The patent literature contains numerous disclosures of surface modification of fluoropolymers for adhesion enhancement. However, most of the cases are related to plasma or chemical surface treatment. A few cases are related to surface modification via graft copolymerization. Almost no case study is directly related to the modification of fluoropolymer via surface graft copolymerizaiton for the improvement of adhesion between two fluoropolymer surfaces, between a fluoropolymer surface and a conjugated polymer surface, or between a fluoropolymer surface and a metal surface. Throughout our exhaustive patent literature search, there is no relevant process which involves the simultaneous modification of a fluoropolymer surface via grafting of graft copolymerization and the simultaneous lamination of a metal in the complete absence of an adhesive.

SUMMARY OF THE INVENTION

It is an object of the present invention to provide a new method for the low temperature direct lamination of copper metal to fluoropolymer surfaces under atmospheric conditions. It is also an object of the present invention to effect the said lamination in the absence of an added adhesive. These and other objects and advantages of the present invention are obtained by providing a method for the modification of fluoropolymer via, first plasma pretreatment, followed by low temperature thermal graft copolymerization of an appropriate functional monomer at the lapped interface between the fluoropolymer and the selected metal. Preferably, a low grafting/lamination temperature is selected to be substantially below the melting or sintering temperature of the fluoropolymer. Desirably, radio frequency argon plasma with low plasma power is selected for the pretreatment of the fluoropolymer to minimize the undesirable over-oxidation, etching or sputtering of the fluoropolymer surface.

The objects and advantages of the present invention can be achieved when the monomers used for surface graft copolymerization with concurrent lamination are selected form a group of vinyl monomers which contain nitrogen heteroatoms or nitrogen functionalities in the pendant group or groups. The monomers are also selected from the family containing multiple vinyl group functionalities, which can also promote chain crosslinking, as well as from the family which contains epoxide functional groups.

The objects and advantages of the present invention can be achieved when the monomer concentrations used for graft copolymerization range from 2 to 100 weight percent. Desirable solvents are selected from the group which provide good solubility for the vinyl monomer, and which promote free radical polymerization.

The objects and advantages of the present invention can be achieved on virtually all fluoropolymer substrates. The maximum objects and advantage are realized on fluoropolymer substrates, such as, but not limited to, poly(tetrafluoroethylene) (PTFE) and its derivatives, composites and copolymers, including the particulate or fiber reinforced fluoropolymer composites, copolymer of tetrafluoroethylene and hexafluoro(propyl vinyl ether), copolymers of tetetrafluoroethylene and perfluoro-2,2-dimethyl-1,3-dioxole, and copolymers of tetrafluoroethylene and vinyl fluoride, poly(vinyl fluoride), poly(vinylidene fluoride), polychlorotrifluoroethylene, vinyl floride/vinylidene fluoride copolymer, and vinylidene fluoride/hexafluoroethylene copolymer.

The objects and advantages of the present invention are obtained when the metals for lamination are selected from copper and its alloys.

DESCRIPTION OF PREFERRED EMBODIMENTS

While not wishing to be bound by any theory, it is believed that the present invention is based upon the fact that the functional groups of the covalently tethered polymer chains on the fluoropolymer surface interact through charge transfer interactions with the contacting metal surface to result in strong adhesion between the fluoropolymer and copper metal in the complete absence of an applied adhesive. The lamination temperature in the present invention is thus governed by the optimum temperature for surface graft copolymerization and is substantially below the melting point or the sintering temperature of the fluoropolymer.

In the preferred method, the argon plasma pretreated fluoropolymer surfaces are subjected to thermally induced graft copolymerization with reactive vinyl monomers containing the imidazole, epoxide, cationic, anionic or amphoteric functional groups. The plasma pretreatment are carefully controlled to introduce peroxide and hydroxyl peroxide species on the fluoropolymer surfaces to initiate the subsequent surface graft copolymerization, resulting in covalently tethered functional polymer chains on the fluoropolymer surface. When the surface graft copolymerization is carried out in the presence of a contacting metal surface and when the functional groups of the grafted chains are capable of forming strong charge transfer complexes with the metal, strong adhesion of the metal to the fluoropolymer surface is achieved. Furthermore, the simultaneous grafting and lamination process at the polymer-metal interface is effected by thermal decomposition of the peroxides and hydroxyl peroxides at the fluoropolymer surface. The process can be carried out near the peroxide decomposition temperature, which is usually less than 130° C., and under atmospheric condtions in the complete absence of an added polymerization initiator. In the presence of a strong charge transfer interaction between the grafted functional chains and the metal, the joint delaminates by cohesive failure inside the fluoropolymer.

The preferred application and the best advantages of the present invention are obtained from fluoropolymer films, thin sheets or plates, as well as from copper foils, films, thin sheets or plates. Thus, in the preferred method, the surface of the fluoropolymer is first pretreated with radio frequency gas plasma. The selections of plasma type, plasma power and duration for pretreatment are important. High plasma power and long pretreatment time can result in excessive etching of the polymer surface, in surface crosslinking, and in dehalogenation of the polymer sample. The preferred range of plasma power range of treatment time is typically from 10 W to 50 W. The preferred range of treatment time is typically from 5 s to 120 s, and the preferred frequency is typically in the range of 5 kHz to 50 kHz.

Monomers for the simultaneous graft copolymerization and lamination process are selected from a group of vinyl monomers which readily undergo free-radical initiated polymerization. Desirably, the monomers are selected from the family containing the imidazole, epoxide, anionic, cationic or amphoteric functional groups. The range of monomer concentration used for the grafting/lamination typically range from 2 to 100 weight percent. The preferred solvents include dioxane and water, although other organic solvents may be used.

EXAMPLES

The following specific examples are provided to illustrate this invention and the manner in which it may be carried out. It will be understood, however, that the specific details given is each example have been selected for purpose of illustration and are not to be construed as a limitation on the invention. Example 1 provides more details on the conduct of the simultaneous surface graft copolymerization and lamination experiment.

Example 1

In a preferred experimental scale process, an Ar plasma pretreated poly(tetrafluoroethylene) (PTFE) film of size 0.5 cm×2.5 cm and a 0.1 cm thick copper foil of similar size was lapped together in the presence of a small quantity of 1-vinyl imidazole (VIDZ). The lapped area was kept at 0.5 cm×1 cm. The surface of the copper metal was cleaned with a mixture of aqueous 0.01 M HCl/0.01 M $HNO_3$/0.01 M $H_2SO_4$ in the volume proportion of 6:1:1 respectively, before use. The PTFE/VIDZ/Cu assembly was sandwiched between two stainless steel blocks, which provided an equivalent pressure of about 10 N/cm² on the polymer-metal joint. The assembly under pressure was subjected to thermal graft copolymerization and lamination at 120° C. for 2–4 h in a constant temperature oven. After the grafting and lamination process at 120° C., the assembly was allowed to return to room temperature slowly in the well-insulated oven over a period of no less than 6 h. The PTFE-Cu joint so prepared exhibited a T-peel strength exceeding 6 N/cm.

Example 2

In a preferred lamination experiment, an Ar plasma pretreated PTFE film was lapped together with a Cu foil of similar size in the presence of a small quantity of 4-vinyl pyridine (4VP). The PTFE/4VP/Cu assembly was subjected to the thermal grafting with concurrent lamination process at 120° C. under load for 2–4 h. The assembly was cooled by annealing in a well-insulated oven. The PTFE-Cu joint so-prepared exhibited a T-peel strength of no less than 6 N/cm.

Example 3

In a preferred lamination experiment, as Ar plasma pretreated PTFE film was lapped together with a Cu foil of similar size in the presence of a small quantity of 1-vinyl imidazole (VIDZ) containing 1 to 5 wt. % trially-1,3,5-benzenetricarboxylate as a crossliking agent. The assembly was subjected to the thermal grafting with concurrent lamination process at 120° C. under load for 2–4 h. The assembly was cooled to room temperature by annealing. The PTFE-Cu joint so-prepared exhibited a T-peel strength of no less than 8 N/cm and the joint delaminated by cohesive failure inside the fluoropolymer.

Example 4

In another preferred lamination experiment, an Ar plasma pretreated PTFE film was lapped together with a Cu foil of similar size in the presence of a small quantity of 1-vinyl imidazole containing 1 to 5 wt. % of 2,4,6-triallyloxy-1,3,5-triazine as a crosslinking agent. The PTFE-Cu joint after the simultaneous grafting and lamination process exhibited a T-peel strength of no less than 9 N/cm and the joint delaminated by cohesive failure.

Example 5

In yet another preferred lamination experiment, an Ar plasma pretreated PTFE film was lapped together with a Cu foil of similar size in the presence of a small quantity of 1-allyl imidazole containing 1 to 5 wt. % of either 2,4,6-triallyloxy-1,3,5-triazine or triallyl-1,3,5benzenetricarboxylate as a crosslinking agent. The PTFE-Cu joint after the simultaneous grafting and lamination process exhibited a T-peel strength of no less than 9 N/cm and the joint delaminated by cohesive failure.

Example 6

In yet another preferred lamination experiment, an Ar plasma pretreated PTFE film was lapped together with a Cu foil of similar size in the presence of a small quantity of 4-vinyl pyridine (4VP) containing 1 to 5 wt. % of either 2,4,6-triallyloxy-1,3,5-triazine or triallyl-1,3,5-benzenetricarboxylate as a crosslinking agent. The PTFE-Cu joint after the simultaneous grafting and lamination process exhibited a T-peel strength of no less than 9 N/cm and the joint delaminated by cohesive failure.

Example 7

In yet another preferred lamination experiment, an Ar plasma pretreated PTFE film was lapped together with a Cu foil of similar size in the presence of a small quantity of glycidyl methacrylate (GMA)-2-hydroxyethyl methacrylate (HEMA) mixture, or GMA-hydroxyl ethyl acrylate (HEA), or GMA-N-hydroxyl methyl methacrylamide (HMMAAm) mixture. The PTFE-Cu joint after the simultaneous grafting and lamination process exhibited a T-peel strength of no less than 8 N/cm and the joint delaminated by cohesive failure.

Example 8

In yet another preferred lamination experiment, an Ar plasma pretreated PTFE film was lapped together with a Cu foil of similar size in the presence of a small quantity of glycidyl methacrylate (GMA)-1-vinyl imidazole (VIDZ), or GMA-1-allyl imidazole (AIDZ) mixture. The PTFE-Cu joint after the simultaneous grafting and lamination process exhibited a T-peel strength of no less than 9 N/cm and the joint delaminated by cohesive failure.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A method for the lamination of a metal to a fluoropolymer, wherein the fluoropolymer is firstly modified by means of a plasma pretreatment followed by thermal graft polymerization with concurrent lamination of the metal in the presence of a composition including a functional monomer at a lapped interface between the fluoropolymer and the metal.

2. A method according to claim 1, wherein the metal is selected from copper and its alloys.

3. A method according to claim 1 wherein the thermal graft polymerization with concurrent lamination is performed at a temperature substantially below the melting point or sintering temperature of the fluoropolymer.

4. A method according to claim 1, wherein the graft polymerization with concurrent lamination is carried out under atmospheric conditions and in the absence of an added polymerization initiator.

5. A method according to claim 1, wherein radio frequency argon plasma with low plasma power is selected for the pretreatment of the fluoropolymer to minimize overoxidation, etching or sputtering of the fluoropolymer surface.

6. A method according to claim 1, wherein the funtional monomer has one or more vinyl groups with nitrogen heteroatoms or nitrogen functionalities in the pendant vinyl group or groups.

7. A method according to claim 1, wherein the funtional monomer comprises an epoxide functional group.

8. A method according to claim 7, wherein the composition including a functional monomer further comprises a curing agent for the epoxide containing monomer selected from the group consisting of hydroxy or amine methacrylate, hydroxylethyl acrylate, and N-hydroxylmethylmethacrylamide.

9. A method according to claim 1, wherein the funtional monomer is selected from the group consisting of a vinyl-containing monomer, 1-vinyl imidazole, pyridine, glycidyl methacrylate, allyl glycidyl ether, 1-vinyl imidazole (VIDZ), 1-allyl imidazole, 2-vinyl pyridine (2VP), 4-vinyl pyridine (4VP), 2,4,6-triallyloxy-1,3,5-triazine, 1,2,4-trivinylcyclohexane, triallyl-1,3,5-benzenetricarboxylate, an epoxide-containing monomer, a hydroxy-containing monomer, an amine-containing monomer, a polyelectrolyte monomer and a polyampholyte monomer.

10. A method according to claim 1, wherein the fluoropolymer is selected from the group consisting of poly (tetrafluoroethylene)(PTFE), copolymers of tetrafluoroethylene and hexafluoropropylene, copolymers of tetrafluoroethylene and perfluoro(propyl vinyl ether), copolymers of tetrafluoroethylene and perfluoro-2,3-dimethyl-1,3-dioxole, copolymers of tetrafluoroethylene and vinyl fluoride, poly(vinyl fluoride), poly(vinylidene fluoride), polychlorotrifluorethylene, vinyl fluoride/ vinylidene fluoride copolymers, and vinylidene fluoride/ hexafluoroethylene copolymers.

11. A method according to claim 1, wherein the fluoropolymer is in the form of film, sheet, slab, fiber, rod, powder, composite or porous membrane.

12. A method according to claim 1, wherein the metal is in the form of foil, film, sheet or slab.

13. A method according to claim 1, wherein the monomer concentrations used for graft polymerization range from 2 to 100 weight percent.

14. A method according to claim 1 or claim 5, wherein the functional monomer contains imididazole, epoxide, cationic, anionic or amphoteric functional groups.

15. A method according to claim 14, wherein the plasma pretreatment is controlled to introduce peroxide and hydroxyl peroxide species on the fluoropolymer to initiate the subsequent graft copolymerization, said plasma pretreatment being carried out near the peroxide decomposition temperature and under atmospheric conditions.

16. A method according to claim 15, wherein the plasma pretreatment is performed with a plasma power in the range of 10 W to 50 W, a treatment time of about 5 to about 120 seconds, and a frequency in the range of 5 kHz to 50 kHz.

* * * * *